United States Patent [19]

Ebinuma et al.

[11] Patent Number: 5,577,552
[45] Date of Patent: Nov. 26, 1996

[54] TEMPERATURE CONTROLLING DEVICE FOR MASK AND WAFER HOLDERS

[75] Inventors: Ryuichi Ebinuma, Kawasaki; Takao Kariya, Hino; Nobutoshi Mizusawa, Yamato; Koji Uda, Yokohama; Eiji Sakamoto, Sagamihara; Shunichi Uzawa, Tokyo, all of Japan

[73] Assignee: Canon Kabushiki Kaisha, Tokyo, Japan

[21] Appl. No.: 412,101

[22] Filed: Mar. 28, 1995

Related U.S. Application Data

[63] Continuation of Ser. No. 148,541, Nov. 8, 1993, abandoned, which is a continuation of Ser. No. 804,515, Dec. 10, 1991, abandoned, which is a continuation of Ser. No. 415,775, Oct. 2, 1989, abandoned.

[30] Foreign Application Priority Data

Oct. 3, 1988 [JP] Japan ................................. 63-247493
Jul. 31, 1989 [JP] Japan ................................. 1-96952

[51] Int. Cl.$^6$ ................................. F28D 15/00
[52] U.S. Cl. ................ 165/296; 165/101; 165/104.32; 165/104.33; 378/34; 378/35; 378/208; 250/443.1
[58] Field of Search ................ 378/34, 35, 208; 250/443.1; 165/34, 101, 33, 31, 38, 39, 40; 237/69

[56] References Cited

U.S. PATENT DOCUMENTS

| | | | |
|---|---|---|---|
| 1,393,479 | 10/1921 | Zarucha | 165/101 |
| 1,621,620 | 3/1927 | Bast | 165/33 |
| 1,713,776 | 5/1929 | Moore | 165/101 |
| 1,827,568 | 10/1931 | Donadio | 165/101 |
| 1,997,003 | 4/1935 | Marguard | 165/51 |
| 2,366,089 | 12/1944 | Dewan | 165/34 |
| 3,167,113 | 1/1965 | Kleiss | 165/34 |
| 3,360,032 | 12/1967 | Sherwood | 165/39 |
| 3,586,101 | 6/1971 | Chu | 165/101 |
| 3,609,991 | 10/1971 | Chu et al. | 361/385 |
| 3,624,390 | 11/1971 | Watanabe | 250/443.1 |
| 3,719,502 | 3/1973 | Keely | 165/39 |
| 3,871,444 | 3/1975 | Houser et al. | 165/101 |
| 4,852,133 | 7/1989 | Ikeda et al. | 378/34 |
| 4,865,123 | 9/1989 | Kawashima et al. | 165/104.33 |
| 4,881,591 | 11/1989 | Rignall | 165/61 |
| 4,916,322 | 4/1990 | Glavish et al. | 378/34 |
| 5,063,582 | 11/1991 | Mori et al. | 378/34 |

FOREIGN PATENT DOCUMENTS

| | | |
|---|---|---|
| 2638702 | 3/1978 | Germany . |
| 2912594 | 10/1980 | Germany ........................ 237/69 |
| 2021034 | 11/1979 | United Kingdom . |

OTHER PUBLICATIONS

McCoy et al. "Mash Alignment For The Fabrication of Integrated Circuits Using X–Ray Lithography" Solid State Technology Sep. 1976 pp. 59–64, (Copy in 378–34).

Hughes "X–Ray Lithography For IC Processing" Solid State Technology May 1977 vol. 20, No. 5 pp. 39–42 (Copy in 378–34).

Kunststoffberater, vol. 33, No. 5, May 1988, p. 42, B. Melz et al. (translation).

Primary Examiner—John K. Ford
Attorney, Agent, or Firm—Fitzpatrick, Cella, Harper & Scinto

[57] ABSTRACT

A temperature controlling device suitably usable in a semiconductor microcircuit manufacturing exposure apparatus exposes a semiconductor wafer to a mask to print a pattern of the mask on the wafer. The device includes a constant-temperature liquid medium supplying system for controlling temperature of a liquid at high precision, a distributing system for distributing the supplied liquid medium into plural flow passages, to supply the liquid medium to plural subjects of control such as, for example, a mask stage, a wafer stage and the like. The device further includes a plurality of temperature controls each being provided in corresponding one of the flow passages, for correction of any variance in temperature of the distributed liquid medium, resulting from pressure loss energies in the respective flow passages. Thus, temperatures of plural subjects of control can be controlled efficiently and with a simple structure.

4 Claims, 5 Drawing Sheets

TEMPERATURE CONTROLLING DEVICE FOR MASK AND WAFER HOLDERS

This application is a continuation of application Ser. No. 08/148,541, filed Nov. 8, 1993, which is a continuation of application Ser. No. 07/804,515, filed Dec. 10, 1991, which is a continuation of application Ser. No. 07/415,775, filed Oct. 2, 1989, now all abandoned.

FIELD OF THE INVENTION AND RELATED ART

This invention relates to a temperature controlling device usable in a semiconductor exposure apparatus, for example. More particularly, the invention is concerned with a temperature controlling device for use with plural portions to be temperature-controlled, for precisely controlling temperatures of these portions by using liquid medium.

In an apparatus such as, for example, a semiconductor exposure apparatus in which precise dimension control is required, temperature control is one important problem, For example, many proposals have been made in respect to temperature control of a wafer or a mask in an exposure apparatus. Particularly, because of an advantage of large heat transmissibility, the temperature control using liquid medium has good controllability and high-practicability, and for this reason, it has been used widely.

SUMMARY OF THE INVENTION

However, in such type of devices wherein the temperature control is made by thermally coupling the subject of temperature control with liquid medium whose temperature is precisely controlled, when the temperature control should be made with precision of an order of 0.01° C., a pressure loss in a liquid medium passageway from a constant-temperature liquid medium supply source to a heat exchanging part for the subject of temperature control, raises a problem which can not be disregarded, in terms of heat.

By way of example, where water is supplied through a thermally insulated tube and if there is a pressure loss of 0.5 Kgf/cm$^2$ in the passageway and if all the lost energy is transformed into a temperature increase in the water, then there occurs a temperature increase of 0.012° C. Also, if plural subjects of temperature control are at different sites and if their passageways through which liquid mediums pass are different in shape and length, then different temperature increases are produced in these passageways due to respective flow passage losses. Accordingly, there is a problem that even if the subjects of temperature control are desired to be controlled to the same temperature, due to the difference in temperature increase resulting from the passageway loss, it is not possible to perform precise temperature control.

In other words, in temperature control for plural subjects of temperature control at a precision of an order of ±0.01° C., heat generation within such temperature control system itself raises a problem. To solve this, a method has been proposed according to which temperature sensors are provided for the subjects of temperature control, respectively, and the subjects of temperature control are controlled individually on the basis of the temperature outputs from the sensors. However, this method involves an inconvenience of necessity of using plural high-precision feedback control devices.

It is accordingly an object of the present invention to provide a temperature control device by which, with a simple structure and at high precision, temperature control can be made to plural subjects of temperature control which are placed at different sites.

In order to achieve this object, a temperature controlling device according to the present invention includes means for supplying a certain constant-temperature liquid medium, distributing means for distributing the liquid medium from the supplying means into plural passageways, and means for controlling the temperatures of the distributed constant-temperature liquid mediums, individually.

According to this structure, plural temperature controlling means are provided each for one of constant-temperature liquid mediums distributed into plural passageways, to be associated with the plural subjects of temperature control, respectively. As a consequence, any variance in temperature of liquid mediums, due to pressure loss energies in the respective liquid medium passageways for the plural subjects of temperature control, can be corrected by the temperature controlling means.

In another aspect, to achieve the above object, a temperature controlling device according to the present invention includes means for supplying a certain constant-temperature liquid medium, distributing means for distributing the constant-temperature liquid medium supplied from the supplying means into plural passageways, heat exchanging portions provided at the passageways to which the constant-temperature liquid medium is distributed by the distributing means, and means for adjusting the flow passage resistance from the distributing means to the heat exchanging part.

With this structure, for each of the constant-temperature liquid mediums in the flow passageways distributed to be associated with the plural subjects of temperature control, the flow rate and the pressure loss to the heat exchanging part can be adjusted by a corresponding flow passage resistance adjusting means, independently from the other or others. By this, any variance in temperature of liquid mediums resulting from the pressure loss energy in the respective liquid medium passageways to the plural subjects of temperature control, can be corrected.

On the other hand, for precise temperature control of a subject to be temperature-controlled, in usual the subject of temperature control is placed in a constant-temperature room which is controlled at a constant temperature. In that case, for attaining high-precision temperature control in the constant-temperature room, it is desirable to reduce, to small, the heat generation in the constant-temperature room and thus the heat generation in the temperature controlling device itself raises a problem that can not be disregarded.

It is accordingly another object of the present invention to provide a temperature controlling device by which high-precision temperature control can be performed in a constant-temperature room.

In order to achieve this object, according to the present invention, a main heat generating portion of a constant-temperature liquid medium supplying device (which is a means for supplying constant-temperature liquid medium) is disposed outside, as possible, the constant-temperature room in which a device to be temperature-controlled is placed. By disposing the main heat generating portion of the constant-temperature liquid medium supplying means outside the room in which the subject of temperature control is placed, temperature variation in the subject of temperature control due to any external effect can be significantly reduced.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
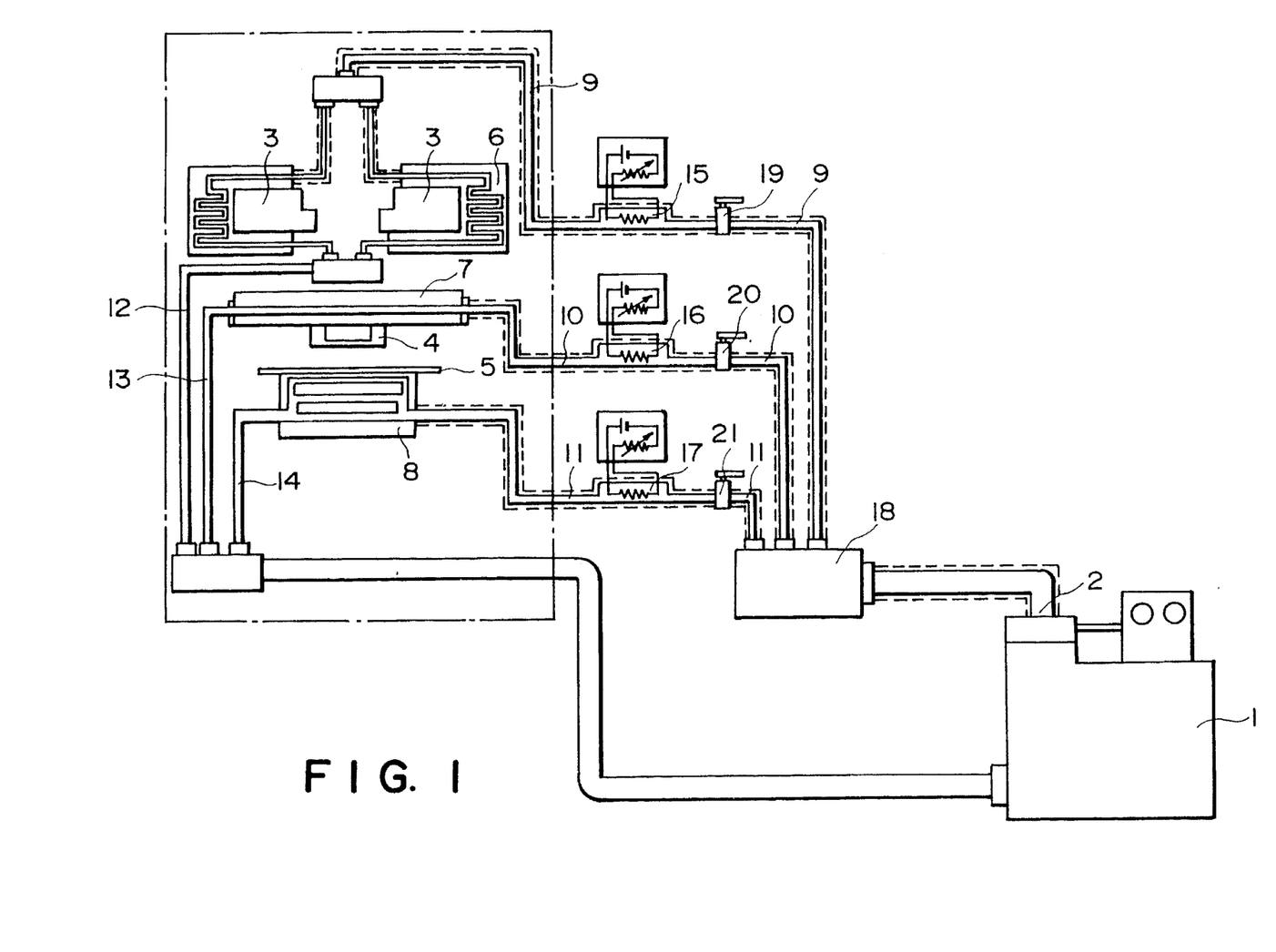
FIG. 1 is a schematic view of a temperature controlling device according to an embodiment of the present invention.

FIG. 1 is a schematic view of a temperature controlling device according to an embodiment of the present invention. Denoted in FIG. 1 at 1 is a constant-temperature liquid medium supplying device which is adapted to supply, at a supply outlet 2 a constant-temperature liquid medium (such as water, for example) of a predetermined temperature and at a predetermined flow rate, whose temperature is controlled at a precision of ±0.01° C. for example. Denoted at 3, 4 and 5 are the subjects of temperature control which are placed at different sites. Denoted at 6, 7 and 8 are heat coupling portions each being arranged to provide high heat transmission factor between a corresponding subject of temperature control and the liquid medium. Where the temperature controlling device of the present embodiment is incorporated into an X-ray exposure apparatus, the subject of temperature control denoted at 4 may be a mask having a pattern for manufacture of semiconductor chips; the subject of temperature control denoted at 5 may be a semiconductor wafer onto which the pattern of the mask 4 is to be printed; the subject of measurement denoted at 3 may be an alignment optical system (pickup) for photoelectrically detecting alignment marks formed on the mask 4 and the wafer 5, for aligning the mask 4 and the wafer 5 into a predetermined positional relationship; the heat coupling portion 6 may be a pickup base which includes a pickup stage for supplying the pickup 3; the heat coupling portion 7 may be a mask stage base which includes a mask stage for holding the mask 4; and the heat coupling portion 8 may be a wafer stage base which includes a wafer stage for holding the wafer 5. In that occasion, the wafer 5 can be exposed to the mask 4 with X-rays from a synchrotron radiation source, not shown. In response to absorption of such an exposure energy, heat generation takes place in each of the subjects of temperature control denoted at 3, 4 and 5.

Denoted at 9, 10 and 11 are liquid medium supply passageways each being formed by a heat insulated tube. These liquid medium supply passageways 9, 10 and 11 have different pressure losses which are different in accordance with the flow rate of liquid medium flowing therethrough or the shape of the flow passage. As a matter of course, these passageways may have the same pressure loss. Denoted at 12, 13 and 14 are collection flow passageways for collection of liquid medium. Denoted at 15, 16 and 17 each is a heat exchanging device having accommodated therein a heater which is controlled so that a constant electric current flows therethrough. The quantities of heat generation of these heat exchanging devices can be adjusted, as desired, in accordance with the pressure losses in the flow passageways 9, 10 and 11, respectively. Therefore, it is possible that the quantities of heat generation are different. Denoted at 18 is a distributor and denoted at 19, 20 and 21 are flow passage adjusting valves for adjusting the flow rates in the corresponding flow passageways 9, 10 and 11.

By way of example, description will now be made of an occasion where, in the described structure, temperature control is to be made to all the subjects of temperature control (3, 4 and 5) to maintain them at a temperature of 20° C.,±0.01° C.

First, the constant-temperature liquid medium supplying device 1 supplies a liquid medium whose temperature is controlled at 19.9°±0.01° C. in preparation for example. The supplied liquid medium is distributed by the distributor 18 into each of the flow passages 9, 10 and 11, and by means of the flow passage adjusting valves 19, 20 and 21 proper and predetermined flow rate distribution is executed to the respective subjects of control.

Further, in the heat exchanging devices 15, 16 and 17, the quantities of heat generation by the respective inside heaters have been set so that the temperatures at the heat coupling portions 6, 7 and 8 are kept at 20° C.±0.01° C. If in this system the flow rate of the liquid medium supplied from the constant-temperature liquid medium supplying device 1 to the respective subjects of temperature control (3, 4 and 5) is constant, then in each flow passageway the pressure loss therein is unchanged while the pressure losses in the flow passageways from the liquid medium supply outlet 2 to the heat coupling portions 6, 7 and 8 for the respective subjects of temperature control may be different from each other. As a consequence, provided that the supply passages 9, 10 and 11 are thermally insulated each of the quantities of temperature rises in these flow passages do not change, although they may be different from each other. In consideration thereof, the magnitude of electric current to each heater may be set so that the quantity of heat generation at the heater of the heat exchanging device 6, 7 or 8 and the quantity of heat generation caused by the pressure loss, total to 0.1° C. By this, it is now possible to supply a liquid medium of 20° C.±0.01° C. to the heat coupling portions 6, 7 and 8 of all the subjects of temperature control (3, 4 and 5).

According to the present invention, as described hereinbefore, it is possible to provide a system for plural subjects of temperature control, which requires high-precision temperature control, by a combination of one precise constant-temperature liquid medium supplying device with a distributor and simple heat exchanging devices such as heaters, for example.

Figure 2:
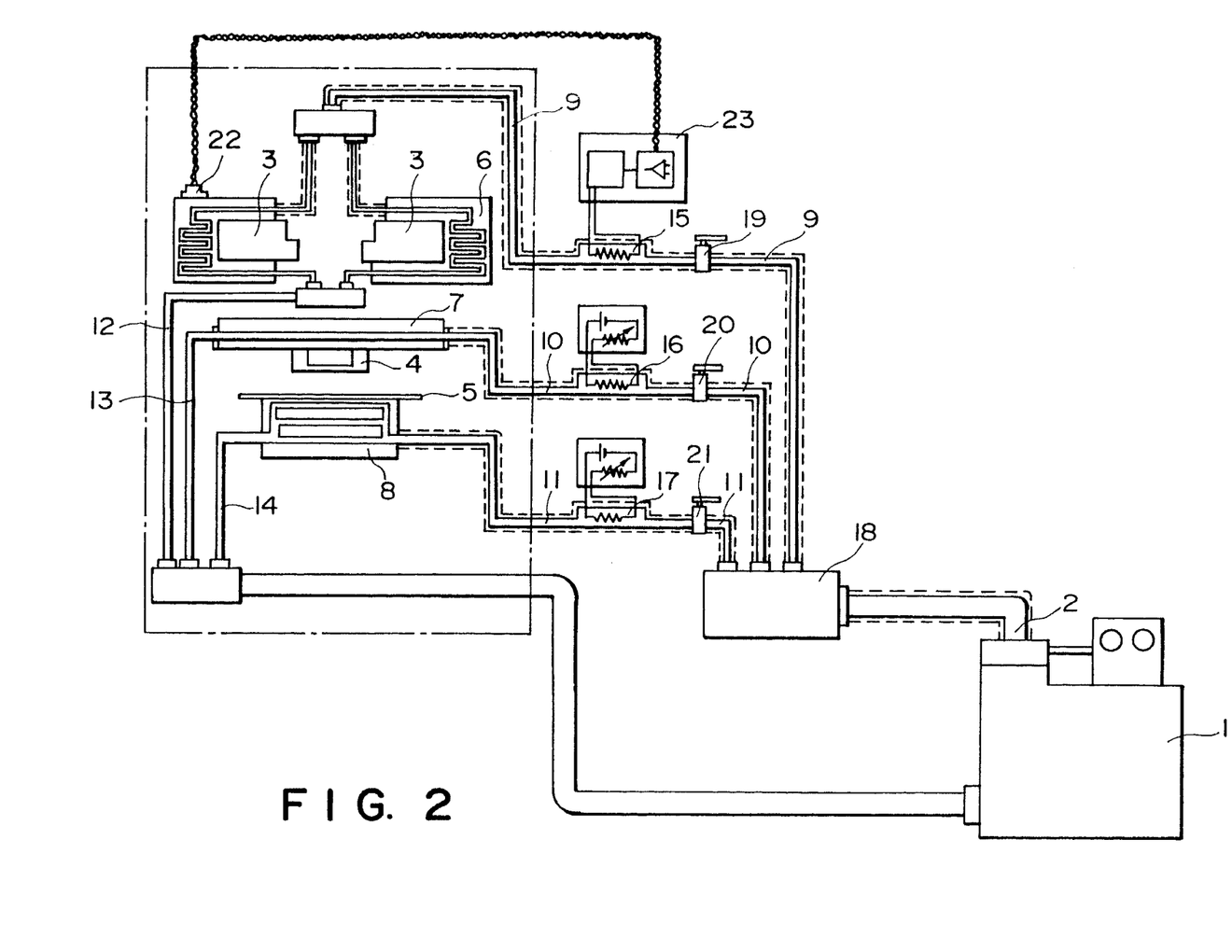
FIG. 2 is a schematic view of a temperature controlling device according to another embodiment of the present invention.

FIG. 2 shows the structure of a temperature controlling device according to another embodiment of the present invention. In FIG. 2, like numerals as those in FIG. 1 are assigned to corresponding elements.

In the present embodiment, a temperature sensor 22 is provided at such part, like the heat coupling portion 6 for the subject of temperature control (3), for example, at which the absorption of exposure energy is irregular so that the degree of heat generation may be considered variable. Additionally, a control device 23 is provided for the heater of the heat exchanging device 15. With this arrangement, the quantity of heat generation by the heater is controlled in response to a signal from the temperature sensor 22, to thereby control the temperature of the subject 3 of temperature control.

The present embodiment will be effective in an occasion where it is desired to change the flow rate of the liquid medium, for example, or in an occasion where the control through a heater of constant heat generation type is difficult because of a change in the temperature ambience of the liquid medium supply flow passage, for example.

While the foregoing embodiments have been explained with reference to examples wherein each heat exchanging device downstream of the distributor comprises a heater, the heat exchanging device is not limited thereto. As an example, a cooling means including a heat exchanging device that uses a cooling medium or, alternatively, a cooling means comprising Pertier element or otherwise, may be used. Further, the heat exchanging device may be controlled in accordance with an externally supplied signal.

In accordance with these embodiments of the present invention, as described hereinbefore, there are provided a precise constant-temperature liquid medium supplying device, a distributor and simple temperature controlling means for controlling the temperatures of liquid mediums distributed by the distributor into respective flow passages. As a consequence, the temperature of plural subjects of temperature control placed at different sites can be controlled at the same time and at a high precision. Additionally, the temperature controlling device according to each of the foregoing embodiments can be provided by a simple structure.

Figure 3:
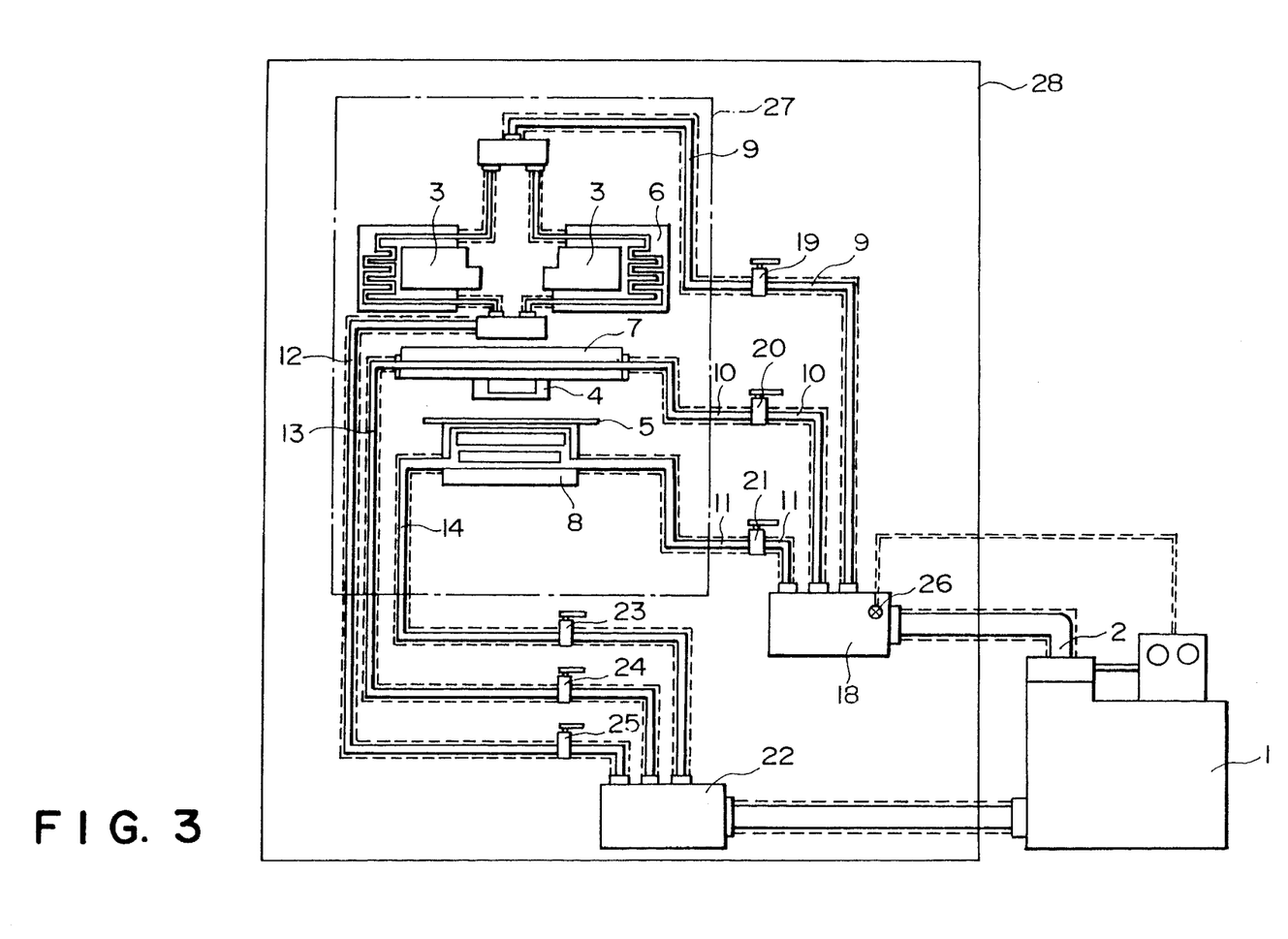
FIG. 3 is a schematic view of a temperature controlling device according to a further embodiment of the present invention.

FIG. 3 is a schematic view of a temperature controlling device according to a further embodiment of the present invention. Denoted in FIG. 3 at 1 is a constant-temperature liquid medium supplying device which is adapted to supply a constant-temperature liquid medium of a predetermined temperature and at a predetermined flow rate, the temperature being controlled at a precision of ±0.01° C., for example. Denoted at 3, 4 and 5 are the subjects of temperature control which are placed at different sites. Denoted at 6, 7 and 8 are heat exchanging portions each being arranged to provide high heat transmission factor between a corresponding subject of temperature control and the liquid medium. Denoted at 9, 10 and 11 are liquid medium supply passageways each being formed by a heat insulated tube. Denoted at 12, 13 and 14 are collection flow passages for the liquid mediums, each being formed by a heat insulated tube. There is a possibility that the liquid medium supply passageways 9, 10 and 11 and heat exchanging portions 6, 7 and 8 as well as the liquid medium collecting flow passages 12, 13 and 14 have different pressure losses, depending on the flow rate of liquid medium flowing through a passage or the shape of the flow passage. Denoted at 18 and 22 are distributors for distributing the liquid medium from the precise constant-temperature liquid medium supplying device 1 to the heat exchanging portions 6, 7 and 8 of the different subjects of temperature control. Temperature sensor 26 is provided within the distributor 18, and the constant-temperature liquid medium supplying device 1 is controlled so that the temperature as indicated by the temperature sensor 26 is constant. Denoted at 19, 20 and 21 are adjusting valves which are provided in the liquid medium supplying passages 9, 10 and 11, respectively. Denoted at 23, 24 and 25 are adjusting valves which are provided in the liquid medium collecting passages 14, 13 and 12, respectively.

Figure 4:
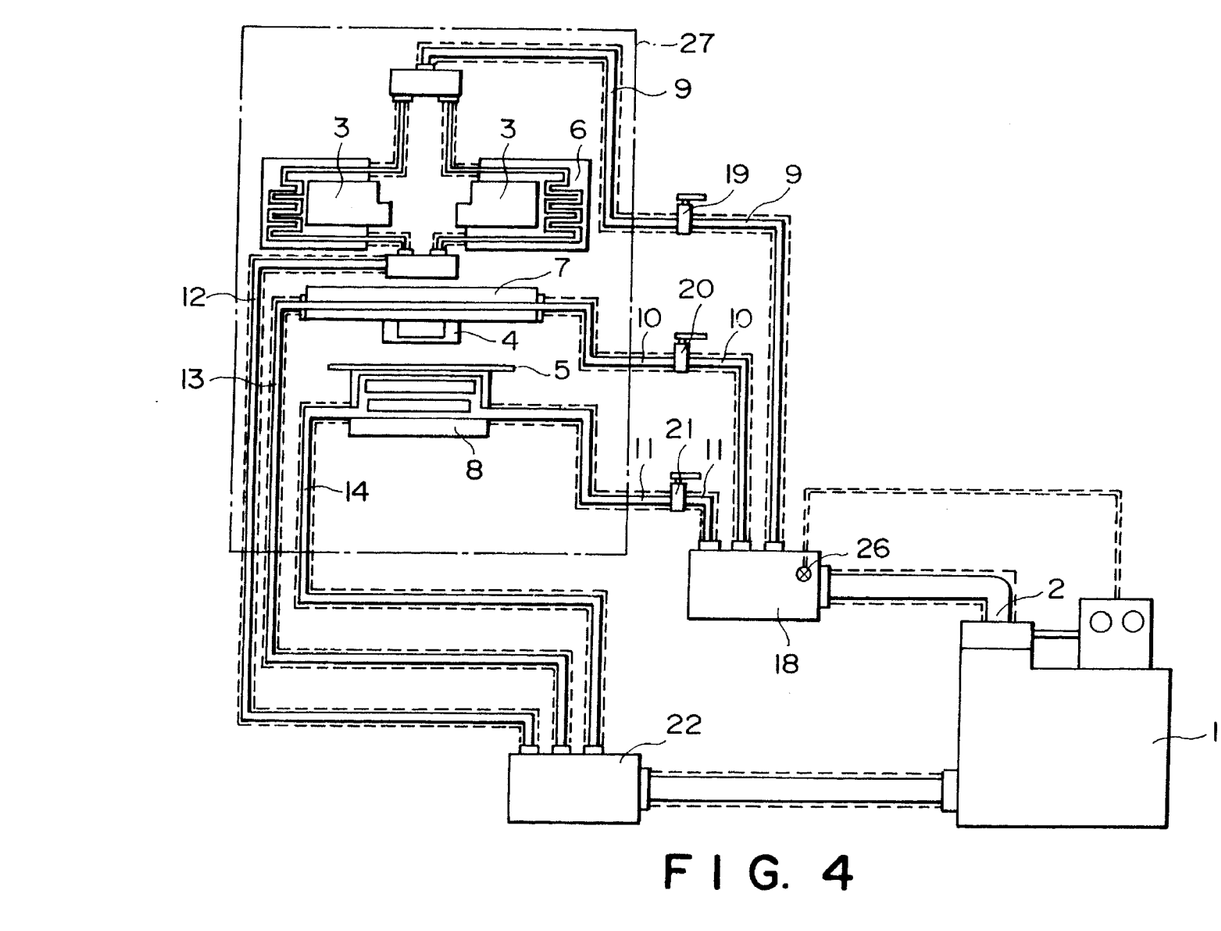
FIG. 4 is a schematic view of a temperature controlling device having no pressure adjusting valve.

In the temperature controlling device structured as above, a liquid medium flows through each heat exchanging portion 6, 7 or 8, at a flow rate sufficient for quickly removing heat generated by a corresponding subject of temperature control and, by this, the temperature of each subject of temperature control can be stabilized. To this end, since the subjects of temperature control (3, 4 and 5) are different in the quantity of heat generation, for efficient liquid medium supply it is necessary to flow, at a proper flow rate, a liquid medium to a corresponding and properly designed heat exchanging portion 6, 7 or 8, in accordance with the degree of heat generation thereat. This may be assured only by providing adjusting valves for flow rate adjustment, in the flow passageways from the distributor 18 to the heat exchanging portions 6, 7 and 8, such as by providing adjusting valves 19, 20 and 21 in the liquid medium flow passages 9, 10 and 11, as shown in FIG. 4, while the adjusting valves 23, 24 and 25 in the liquid medium collecting passages may be considered unnecessary. In that occasion, however, the pressure losses from the distributor 18 to the heat exchanging portions 6, 7 and 8 will be different from each other.

Figure 6:
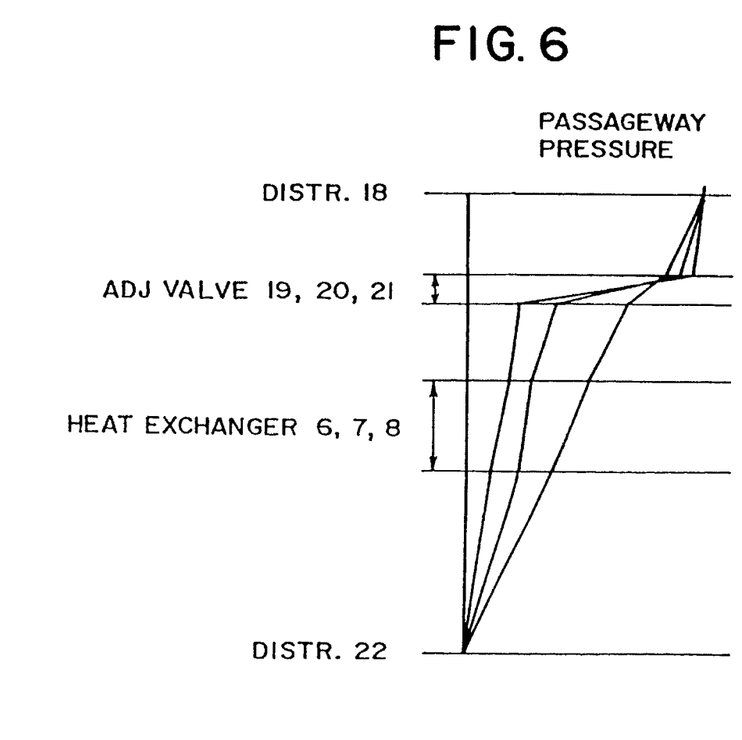
FIG. 6 is a representation, explicating the manner of production of pressure loss in a flow passage, in the device of FIG. 4.

More specifically, as a result of the adjustment of the flow passage resistances by the adjusting valves 19, 20 and 21, as the liquid mediums each being set at a proper flow rate go through respective flow passages from the distributor 18 to the distributor 22 by way of the liquid medium supply passages 9, 10 and 11, the adjusting valves 19, 20 and 21, the heat exchanging portions 6, 7 and 8 and the liquid medium collecting flow passages 12, 13 and 14, the pressures in the respective flow passages decrease in different manners. FIG. 6 shows this: wherein three broken lines depict changes in pressure within the respective flow passages.

Figure 5:
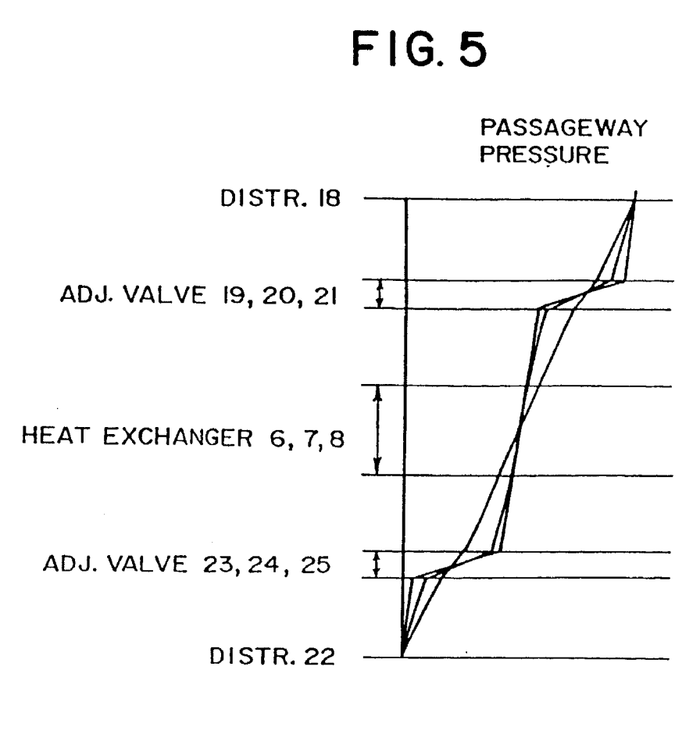
FIG. 5 is a representation, explicating the manner of production of pressure loss in a flow passage, in the device of FIG. 3.

It is seen in FIG. 6 that, at the heat exchanging portions 6, 7 and 8, the pressures in the flow passages are different from each other, while at the distributor 18 the liquid mediums have the same temperature. Therefore, as a result of the temperature rise in the liquid medium due to the pressure loss energy, at the heat exchanging portions 6, 7 and 8 the liquid mediums have different temperatures. Where the liquid medium is water, such temperature rise is 0.012° C. per a pressure loss of 0.5 kg/cm$^2$, the quantity of which can not be disregarded to attain temperature control of a precision of ±0.01° C. In consideration thereof, as shown in FIG. 3, there are provided additional adjusting valves 25, 24 and 23 in the liquid medium collecting passages 12, 13 and 14 for adjustment of flow passage resistance, and by using these supply side (upstream side) and collection side (downstream side) adjusting valves 19–21 and 23–25, the pressure loss is shared. This allows that the pressures and flow rates at the heat exchanging portions 6, 7 and 8 are set individually. The pressure change in each passageway when the described is adopted is illustrated in FIG. 5. The illustrated is an example wherein, by means of the adjusting valves which are upstream of and downstream of the heat exchanging portions, at the heat exchanging portions approximately the same pressure is attained.

With this structure, in the different passageways, the pressure losses up to the respective heat exchanging portions 6, 7 and 8 will be of substantially the same level and therefore, the rises in temperature due to the pressure loss energies will be of substantially the same level. As a result, at the heat exchanging portions 6, 7 and 8, the liquid mediums can have substantially the same temperature.

In regard to FIG. 5, description has been made to an example wherein at the heat exchanging portions the liquid mediums have the same pressure. However, in each passageway, the pressure at the heat exchanging portion can be adjusted without changing the flow rate of the liquid medium, by changing the balance of the two adjusting valves at the supply side and at the collection side. Therefore, it is possible to change the temperature of the liquid medium at heat exchanging portion, by utilizing the temperature rise due to the pressure loss energy.

Generally, in order to minimize the effect of external temperature, enclosed apparatus 27 as a whole (the subject of temperature control) is placed within a constant temperature room 28 whose temperature is controlled at a constant. In order to maintain the constant-temperature state of such a constant-temperature room with good precision, it is desirable that the heat generation within the constant temperature room is small. However, the constant-temperature liquid medium supplying device 1 includes large heat generation sources such as a water supplying pump, a discharge passageway for high-temperature primary cooling water and the like. In consideration thereof, as shown in FIG. 3, such part of the constant-temperature liquid medium supplying device 1 that contains these heat generation sources is disposed outside the constant temperature room 28, to thereby minimize the effect of heat from the heat generation sources of the constant-temperature liquid medium supplying device 1. The constant temperature room may be an air-conditioned room or a closed space, enclosed simply by partitions. Alternatively, it may be a precise constant-temperature chamber.

In accordance with this embodiment of the present invention, as described hereinbefore, pressure losses in flow passages from a constant-temperature water supplying means to heat exchanging portions of plural subjects of temperature control, can be made adjustable by means of supply side and collection side adjusting valves. As a result, it is possible to correct individually any variance in temperature at the heat exchanging portions, due to the pressure losses and, therefore, it is possible to make a high-precision control, with a simple structure, to plural subjects of temperature control through a single fine constant-temperature water supplying means.

Further, since a main heat generating portion of the fine constant-temperature water supplying means can be isolated from a space in which the subject of temperature control, as a whole, is placed, it is possible to avoid the effect of the heat generating portion. Therefore, the precision of temperature control can be improved significantly.

While the invention has been described with reference to the structures disclosed herein, it is not confined to the details set forth and this application is intended to cover such modifications or changes as may come within the purposes of the improvements or the scope of the following claims.

What is claimed is:

1. A method of controlling a temperature of an exposure system having a mask holder for holding a mask with a pattern and a wafer holder for holding a wafer to be exposed to the pattern of the mask, said method comprising the steps of:

providing a first flow passageway having a first heat exchanging portion proximate to the mask holder, the first flow passageway further having first and second adjusting valves disposed upstream and downstream, respectively, of the first heat exchanging portion with respect to a flow path in the first flow passageway;

providing a second flow passageway having a second heat exchanging portion proximate to the wafer holder, the second flow passageway further having third and fourth adjusting valves disposed upstream and downstream, respectively, of the second heat exchanging portion with respect to a flow path in the second flow passageway;

supplying and distributing a liquid medium to the first and second flow passageways;

regulating opening of the first and second adjusting valves to set a particular pressure loss in the first flow passageway and regulating opening of the third and fourth adjusting valves to set a particular pressure loss in the second flow passageway, with pressures set at the first and second heat exchanging portions being substantially equal such that temperatures of the liquid medium in said first and second heat exchanging portions are substantially equal.

2. An exposure system for exposing a wafer to a pattern of a mask, comprising:

a mask holder for holding the mask;

a wafer holder for holding the wafer;

liquid medium supplying means for supplying a liquid medium of a predetermined temperature;

flow passage means having first and second flow passageways;

a distributor for distributing the liquid medium from said supplying means to the first and second flow passageways;

a first heat exchanging portion defined along the first flow passageway and provided proximate to said mask holder;

a second heat exchanging portion defined along the second flow passageway and provided proximate to said wafer holder;

a first adjusting valve provided in said first flow passageway, said first adjusting valve being disposed downstream of said distributor and upstream of said first heat exchanging portion;

a second adjusting valve provided in said first flow passageway, said second adjusting valve being disposed downstream of said first heat exchanging portion;

a third adjusting valve provided in said second flow passageway, said third adjusting valve being disposed downstream of said distributor and upstream of said second heat exchanging portion;

a fourth adjusting valve provided in said second flow passageway, said fourth adjusting valve being disposed downstream of said second heat exchanging portion; wherein opening of said first and second adjusting valves is regulated to set a particular pressure loss in the first flow passageway and opening of said third and fourth adjusting valves is regulated to set a particular pressure loss in the second flow passageway, with pressures set at the first and second heat exchanging portions being substantially equal such that temperatures of the liquid medium in said first and second heat exchanging portions are substantially equal.

3. An apparatus according to claim 2, further comprising a temperature controlled room, wherein said mask holder and said wafer holder are disposed inside the room and wherein said Liquid medium supplying means is disposed outside the room.

4. An apparatus for controlling temperature, comprising:

liquid medium supplying means for supplying a liquid medium of a predetermined temperature;

flow passage means having first and second flow passageways;

a distributor for distributing the liquid medium from said supplying means to the first and second flow passageways;

a first heat exchanging portion defined along the first flow passageway;

a second heat exchanging portion defined along the second flow passageway;

a first adjusting valve provided in said first flow passageway, said first adjusting valve being disposed downstream of said distributor and upstream of said first heat exchanging portion;

a second adjusting valve provided in said first flow passageway, said second adjusting valve being disposed downstream of said first heat exchanging portion;

a third adjusting valve provided in said second flow passageway, said third adjusting valve being disposed downstream of said distributor and upstream of said second heat exchanging portion;

a fourth adjusting valve provided in said second flow passageway, said fourth adjusting valve being disposed downstream of said second heat exchanging portion; wherein opening of said first and third adjusting valves are regulated to set particular pressure loss in the first and second flow passageways such that temperatures of the liquid medium supplied to said first and second heat exchanging portions are adjusted, and opening of said second and fourth adjusting valves are regulated in accordance with the regulations of said first and third valves such that particular flow rates in said first and second flow passageways are set.

* * * * *

UNITED STATES PATENT AND TRADEMARK OFFICE
CERTIFICATE OF CORRECTION

PATENT NO. : 5,577,552
DATED : November 26, 1996
INVENTOR(S) : Ebinuma et al.

It is certified that error appears in the above-indentified patent and that said Letters Patent is hereby corrected as shown below:

On the title page, item
[30] FOREIGN APPLICATION PRIORITY DATA:

"Jul. 31, 1989  [JP]  Japan ........ 1-96952" should read
--Jul. 31, 1989  [JP]  Japan ........ 1-196952--.

COLUMN 2:

Line 39, "in usual" should read --usually--.

COLUMN 8:

Line 52, "apparatus" should read --exposure system--.

Signed and Sealed this

Fifth Day of August, 1997

Attest:

BRUCE LEHMAN

*Attesting Officer*              *Commissioner of Patents and Trademarks*